United States Patent
Hofmann et al.

(10) Patent No.: US 7,157,768 B2
(45) Date of Patent: Jan. 2, 2007

(54) NON-VOLATILE FLASH SEMICONDUCTOR MEMORY AND FABRICATION METHOD

(75) Inventors: Franz Hofmann, Munich (DE); Erhard Landgraf, Munich (DE); Wolfgang Rosner, Ottobrunn (DE); Michael Specht, Munich (DE); Martin Staedele, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 154 days.

(21) Appl. No.: 10/991,345

(22) Filed: Nov. 9, 2004

(65) Prior Publication Data

US 2005/0139893 A1    Jun. 30, 2005

Related U.S. Application Data

(63) Continuation of application No. PCT/DE03/01489, filed on May 9, 2003.

(30) Foreign Application Priority Data

May 10, 2002    (DE) ................ 102 20 923

(51) Int. Cl.
*H01L 27/115* (2006.01)
(52) U.S. Cl. .............. 257/315; 257/314; 257/331
(58) Field of Classification Search ............ 257/315, 257/314, 331
See application file for complete search history.

(56) References Cited

U.S. PATENT DOCUMENTS

| | | | |
|---|---|---|---|
| 5,411,905 A | 5/1995 | Acovic et al. | |
| 6,201,277 B1 | 3/2001 | Esquivel | |
| 6,288,431 B1 | 9/2001 | Iwasa et al. | |
| 6,580,137 B1 * | 6/2003 | Parke | 257/401 |
| 6,768,158 B1 * | 7/2004 | Lee et al. | 257/315 |
| 6,847,084 B1 * | 1/2005 | Ono et al. | 257/368 |
| 6,902,991 B1 * | 6/2005 | Xiang et al. | 438/510 |
| 6,903,967 B1 * | 6/2005 | Mathew et al. | 365/177 |
| 6,911,383 B1 * | 6/2005 | Doris et al. | 438/588 |
| 6,933,558 B1 * | 8/2005 | Hill et al. | 257/324 |
| 6,958,512 B1 * | 10/2005 | Wu et al. | 257/315 |
| 6,963,104 B1 * | 11/2005 | Wu et al. | 257/315 |
| 6,969,656 B1 * | 11/2005 | Du et al. | 438/268 |
| 6,998,676 B1 * | 2/2006 | Kondo et al. | 257/329 |
| 7,002,207 B1 * | 2/2006 | Kim et al. | 257/331 |
| 7,015,126 B1 * | 3/2006 | Wu et al. | 438/592 |
| 7,026,688 B1 * | 4/2006 | Kim et al. | 257/331 |
| 7,087,950 B1 * | 8/2006 | Willer et al. | 257/314 |
| 2003/0042531 A1 * | 3/2003 | Lee et al. | 257/315 |
| 2004/0046227 A1 * | 3/2004 | Ono et al. | 257/500 |
| 2004/0063286 A1 * | 4/2004 | Kim et al. | 438/283 |

(Continued)

FOREIGN PATENT DOCUMENTS

DE    196 46 419 C1    4/1998

(Continued)

OTHER PUBLICATIONS

Choi, Yang-Kyu et al.; "Sub-20nm CMOS FinFET Technologies"; International Electron Device Meeting (IEDM), 2001.

(Continued)

*Primary Examiner*—Laura M. Schillinger
(74) *Attorney, Agent, or Firm*—Dickstein, Shapiro, LLP.

(57) ABSTRACT

In a semiconductor memory, a plurality of FinFET arrangements with trapping layers or floating gate electrodes as storage mediums are present on respective top sides of fins made from semiconductor material. The material of the gate electrodes is also present on two side walls of the fins, in order to form side wall transistors, and between the gate electrodes forms parts of a word line belonging to the corresponding fin.

7 Claims, 4 Drawing Sheets

U.S. PATENT DOCUMENTS

| | | | |
|---|---|---|---|
| 2004/0087114 A1* | 5/2004 | Xiang et al. | 438/478 |
| 2004/0209463 A1* | 10/2004 | Kim et al. | 438/666 |
| 2004/0235300 A1* | 11/2004 | Mathew et al. | 438/689 |
| 2004/0251487 A1* | 12/2004 | Wu et al. | 257/315 |
| 2005/0026377 A1* | 2/2005 | Kawasaki et al. | 438/301 |
| 2005/0040461 A1* | 2/2005 | Ono et al. | 257/338 |
| 2005/0056892 A1* | 3/2005 | Seliskar | 257/348 |
| 2005/0057964 A1* | 3/2005 | Mathew et al. | 365/177 |
| 2005/0077574 A1* | 4/2005 | Mouli | 257/347 |
| 2005/0121716 A1* | 6/2005 | Hill et al. | 257/324 |
| 2005/0124120 A1* | 6/2005 | Du et al. | 438/283 |
| 2005/0128787 A1* | 6/2005 | Mouli | 365/149 |
| 2005/0139893 A1* | 6/2005 | Hofmann et al. | 257/314 |
| 2005/0186738 A1* | 8/2005 | Hofmann et al. | 437/267 |
| 2005/0199913 A1* | 9/2005 | Hofmann et al. | 257/204 |
| 2006/0001058 A1* | 1/2006 | Dreeskornfeld et al. | 257/288 |
| 2006/0003526 A1* | 1/2006 | Brederlow et al. | 438/250 |
| 2006/0115978 A1* | 6/2006 | Specht et al. | 438/637 |
| 2006/0181925 A1* | 8/2006 | Specht et al. | 365/185.17 |

FOREIGN PATENT DOCUMENTS

| | | | |
|---|---|---|---|
| DE | 10260334 A | * | 5/2002 |
| JP | 5-343680 A | | 12/1993 |
| JP | 5-343681 A | | 12/1993 |
| WO | WO 3096424 A1 | * | 11/2003 |
| WO | WO 2004023519 A2 | * | 3/2004 |
| WO | WO 2004023556 A1 | * | 3/2004 |

OTHER PUBLICATIONS

Eitan, B., et al.; "NROM: A Novel Localized Trapping, 2-Bit Nonvolatile Memory Cell"; IEEE Electron Device Letters, vol. 21, No. 11, Nov. 2000, pp. 543-545.

* cited by examiner

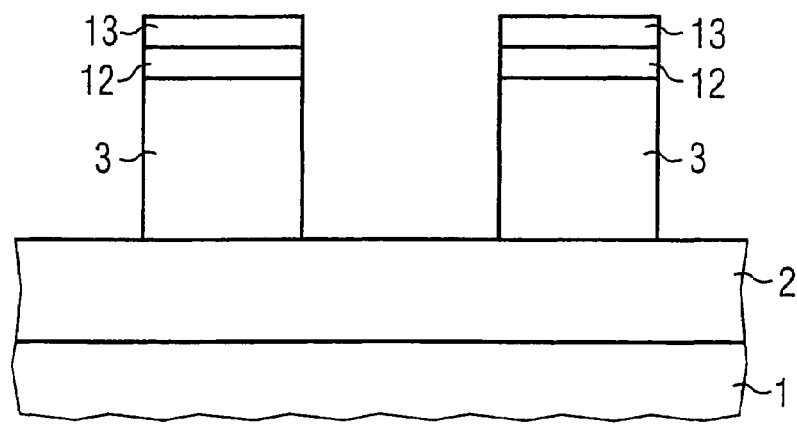
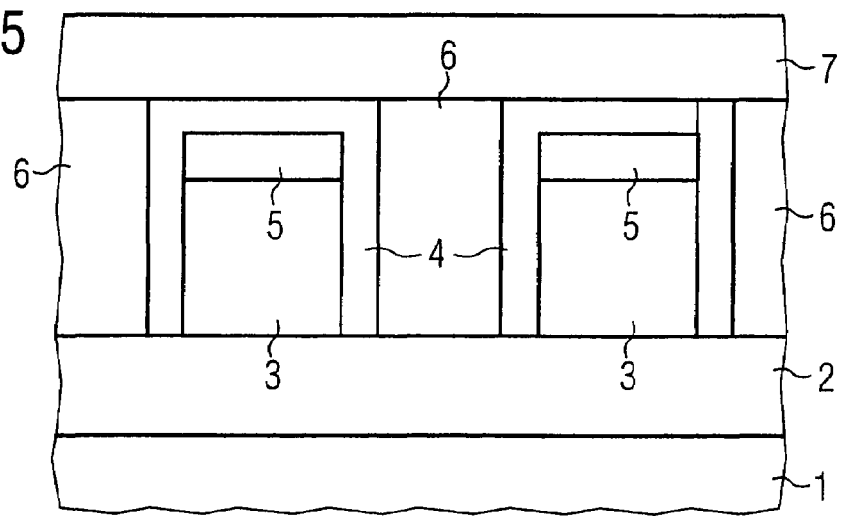
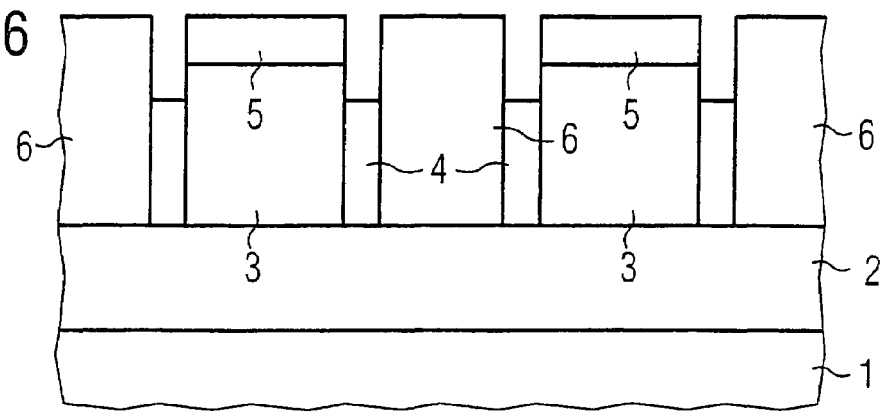

NON-VOLATILE FLASH SEMICONDUCTOR MEMORY AND FABRICATION METHOD

CROSS-REFERENCE TO RELATED APPLICATION

This application is a continuation of International Patent Application Serial No. PCT/DE03/01489, filed May 9, 2003, which published in German on Nov. 20, 2003 as WO 03/096424, and is incorporated herein by reference in its entirety.

FIELD OF THE INVENTION

The present invention relates to a nonvolatile flash semiconductor memory, and to a method of fabricating a nonvolatile flash semiconductor memory.

BACKGROUND OF THE INVENTION

Reducing the size of the floating gate memory transistors to dimensions of less than 100 nm has an adverse effect on the properties of the transistor, since not all the dimensions can be reduced on the same scale. The reason for this is that the gate dielectric has to have a certain minimum thickness in order to ensure that data can be stored for a period of at least ten years.

The publication by Y. K. Choi et al.: "Sub-20 nm CMOS FinFET Technologies", International Electron Device Meeting (IEDM) 2001 has described a FinFET with double gate. A FinFET comprises a fin or narrow web of semiconductor material which connects a source region and a drain region to one another, is provided as the channel region and is provided with a web-like gate electrode which engages over it in the style of a bridge in a transverse direction.

SUMMARY OF THE INVENTION

It is an object of the present invention to provide a nonvolatile flash semiconductor memory with the highest possible storage density which can be fabricated at low cost. Moreover, it-is intended to provide an associated fabrication method.

The semiconductor memory has a row and column arrangement of bit lines and word lines, with a memory cell being arranged at each crossing point of a bit line and a word line. The bit lines are connected to conductively doped source/drain regions in a respective fin made from semiconductor material, with a channel region in each case being present between two such source/drain regions which adjoin one another in the direction of the word lines.

The channel region can be driven by means of a gate electrode which is connected to a word line and is electrically insulated from the channel region by a gate dielectric. On the top side of the fin, there is a storage layer, in particular a conductive floating gate electrode or an oxide-nitride-oxide layer (trapping layer), which is intended for programming of the memory cell by injecting channel hot electrons and for erasing the memory cell by injecting channel hot holes, is located between the gate electrode and the semiconductor material of the fin.

In the case of the semiconductor memory, a multiplicity of FinFET arrangements with trapping layer or floating gate electrodes as storage medium are present on a top side of a fin formed from semiconductor material. The material of the gate electrodes, which if appropriate are provided as control gate electrodes, is also present on both side walls of the fins in order to form side wall transistors and between the gate electrodes forms parts of a word line belonging to the corresponding fin.

The two side wall transistors and, in addition, the channel beneath the storage medium (top transistor) are preferably used to read the individual memory cells. The charge voltage of the side wall transistor and top transistor shifts as a function of the electric potential of the storage media. Therefore, it is possible to read the memory contents by using the side wall FinFET transistor with a high read current and low voltages to be applied, unlike in the case of the conventional floating gate transistor. Charge carriers can be stored in the storage medium on both the source side and the drain side, so that two bits can be stored per memory transistor. This makes it possible to achieve a storage density of 2 $F^2$ per bit. The programming is carried out, for example, by trapping channel hot electrons (CHEs). The memory can be configured as a one-time programmable memory or as a reprogrammable memory.

BRIEF DESCRIPTION OF THE DRAWINGS

There now follows a more detailed description of an example of the semiconductor memory and of an associated fabrication method with reference to FIGS. 1 to 8.

FIGS. 4 and 5 show cross sections through intermediate products of a method for fabricating the memory, parallel to the bit lines between two bit lines.

FIGS. 6 to 8 show intermediate products of a method for fabricating the semiconductor memory along a bit line.

DETAILED DESCRIPTION OF PREFERRED EMBODIMENTS OF THE INVENTION

Figure 1:
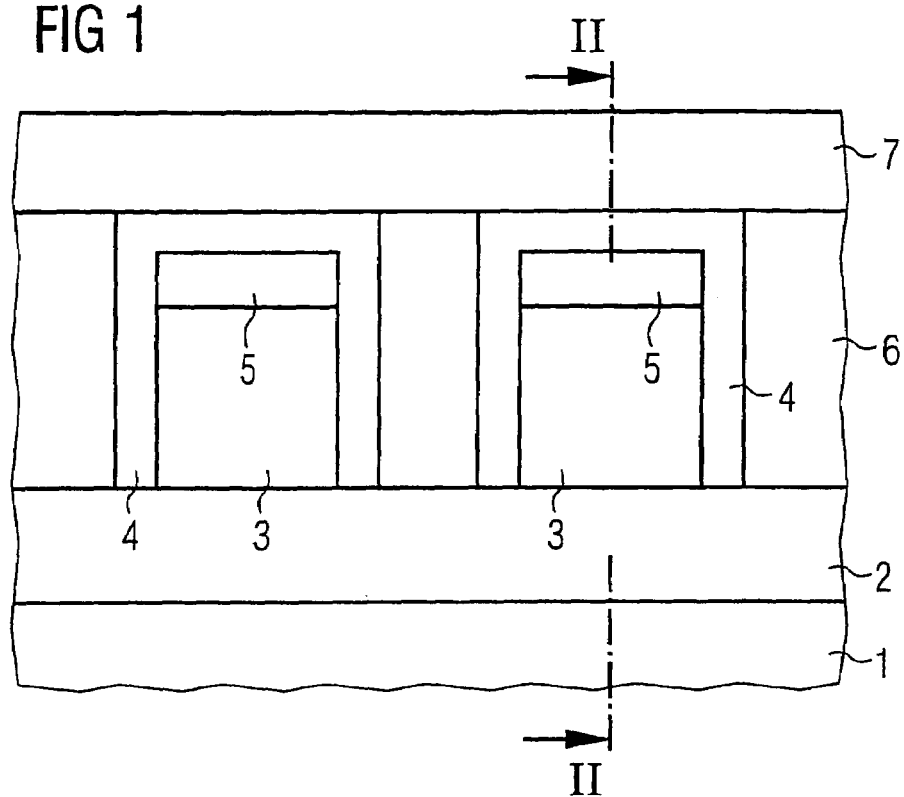
FIG. 1 shows a section through the semiconductor memory between two bit lines parallel to the bit lines.

FIG. 1 shows a cross section through the semiconductor memory parallel to the bit lines between two bit lines and transversely with respect to the word lines. The semiconductor memory is preferably fabricated on an SOI (Silicon On Insulator) substrate. A thick bulk silicon layer 1 is provided with a thin insulation layer 2, on which the thin body silicon layer intended for the components is located.

In the semiconductor memory, this body silicon layer is patterned to form individual fins 3 or webs, a plurality of which are present next to one another and oriented parallel to one another.

The fins or webs are bridged by gate electrodes 4. Between the fins and the gate electrodes there is a thin dielectric as gate dielectric (gate oxide), which is not shown independently in the drawing. A storage layer 5 is located between the top side of the fins 3 and the gate electrodes 4. This storage layer may, for example, be a layer sequence for trapping channel hot electrons (trapping layer). An ONO layer (oxide-nitride-oxide layer) is particularly suitable for this purpose. Alternatively, it is also possible for a floating gate electrode to be provided as storage medium, this electrode being electrically insulated all the way around from the gate electrode 4 and also from the semiconductor material of the fins 3 by insulating material. Storage media of this type and a program and erase operation are known per se from other semiconductor memories.

Between the individual fins there is a dielectric 6, which may, for example, be a nitride, in this case silicon nitride. The gate electrode may be a metal or preferably polysilicon, which is suitably conductively doped. On the top side there is an electrically insulating layer 7, for which, by way of example, TEOS (tetraethyl orthosilicate) can be used. The production of layers of this type is likewise known per se.

Figure 2:
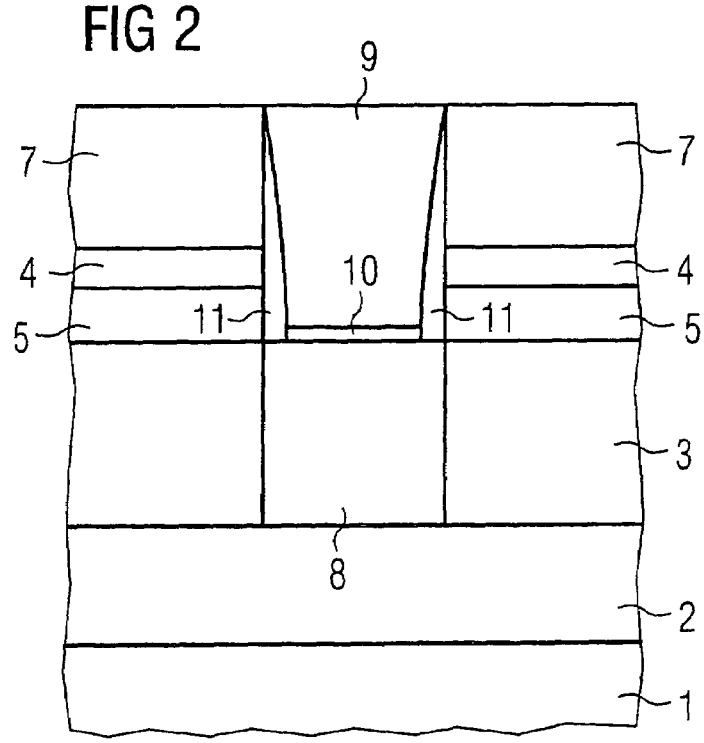
FIG. 2 shows a section through the semiconductor memory parallel to a word line.

FIG. 2 shows a cross section through the semiconductor memory parallel to a word line. In this cross section, the fin 3 runs parallel to the plane of the drawing. Doped regions are formed in the fin 3 as source/drain regions 8. The bit lines 9 are applied to the doped regions, preferably separated by a thin barrier layer 10 of the semiconductor material. The bit lines are, for example, tungsten. Spacer elements 11, preferably formed from nitride or $SiO_2$, are arranged at the sides of the bit lines 9 to electrically insulate the bit lines 9 from the gate electrodes 4.

Figure 3:
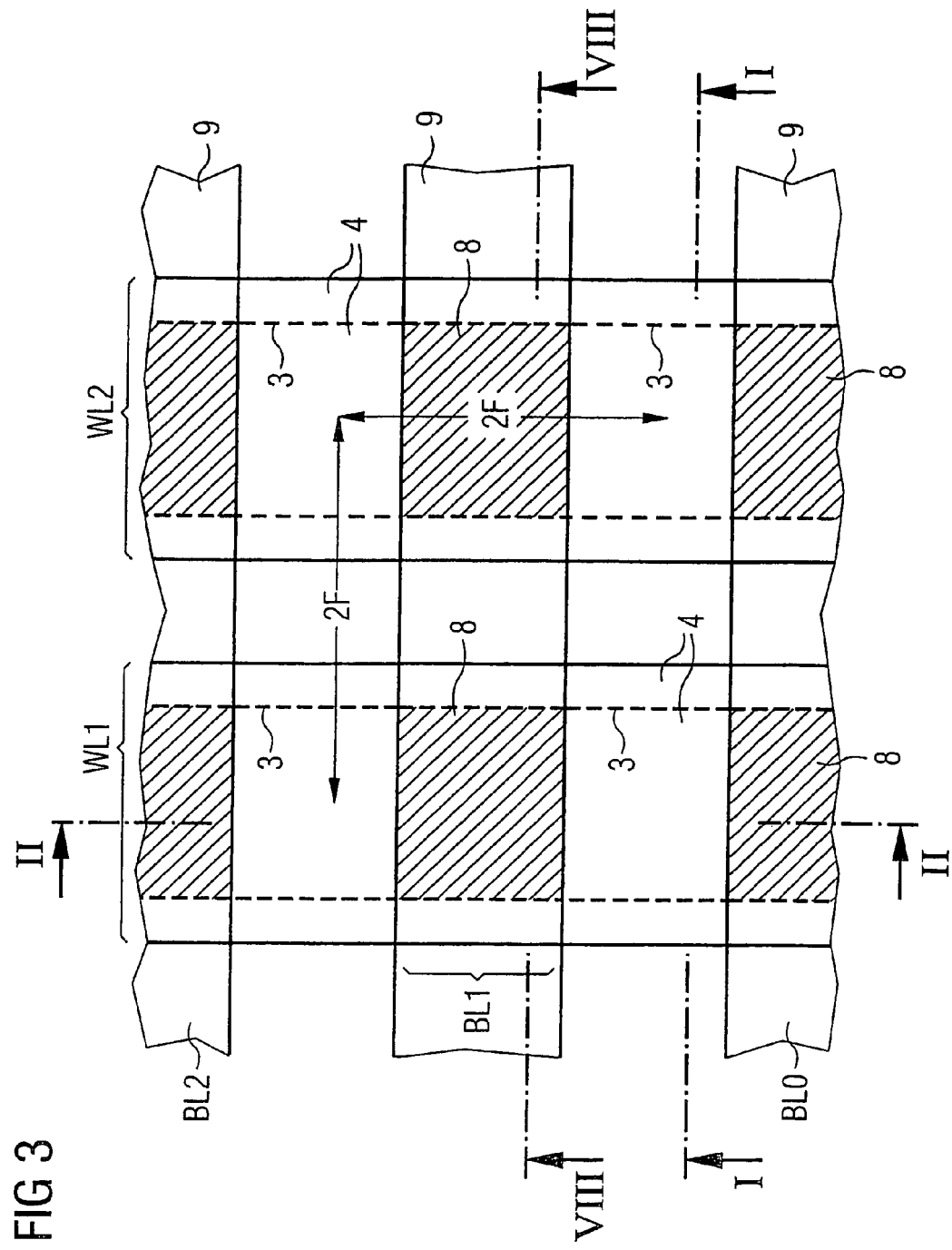
FIG. 3 shows a diagrammatic plan view of the semiconductor memory.

FIG. 3 shows the arrangement of the word lines WL1, WL2, . . . and of the bit lines BL0, BL1, BL2, . . . in the form of a diagrammatic plan view. FIG. 3 also indicates the positions of the cross sections shown in FIGS. 1 and 2. The fins 3 made from semiconductor material are, as covered contours, represented by dashed lines in the drawing. The source/drain regions 8, which are arranged at regular intervals, are clearly marked. The word lines to the gate electrodes 4 are formed between the bit lines. The structure of the word lines in the region of the bit lines is described in more detail below. The word lines have continuous parts at the side walls of the fins 3.

FIG. 4 shows a cross section in accordance with FIG. 1 through an intermediate product of a preferred fabrication method. Starting from an SOI substrate having a bulk silicon layer 1 and an insulation layer 2 with a body silicon layer applied to it, a nitride layer 12 and a polysilicon layer 13 deposited on the top side of this substrate. The layers are etched in accordance with the cross section shown in FIG. 4 to produce fins 3 oriented parallel to one another by means of a photomask technique. Residues of the resist mask are removed. The fins are in each case surrounded by a layer of polysilicon on three sides, the polysilicon layers of adjacent word lines being separated from one another by means of a spacer etch. The polysilicon layer 13 in FIG. 4 serves to connect the polysilicon layers on the two flanks of in each case one fin to one another in the region between two bit lines.

The storage layer 5, which is electrically insulated or has an electrically insulating part, additionally functions as a gate dielectric. The gate electrodes are separated at the ends of the fins 3, in order to separate the word lines from one another. The spaces between the fins are filled with an electrically insulating dielectric 6, preferably silicon nitride. After dielectric material applied to the top side of the fins 3 has been removed, an insulating layer 7 is produced, preferably by means of TEOS.

FIG. 6 illustrates an intermediate product of the fabrication method in a section along a bit line. After the application of the insulating layer 7 as shown in FIG. 5, the material of the gate electrodes 4 is etched back in this region apart from the parts illustrated in FIG. 6. This is done by means of a suitable photomask technique, which covers the regions between the intended bit lines, so that only those parts of the relevant layers (TEOS, polysilicon) which are to be removed are etched back appropriately.

Figure 7:
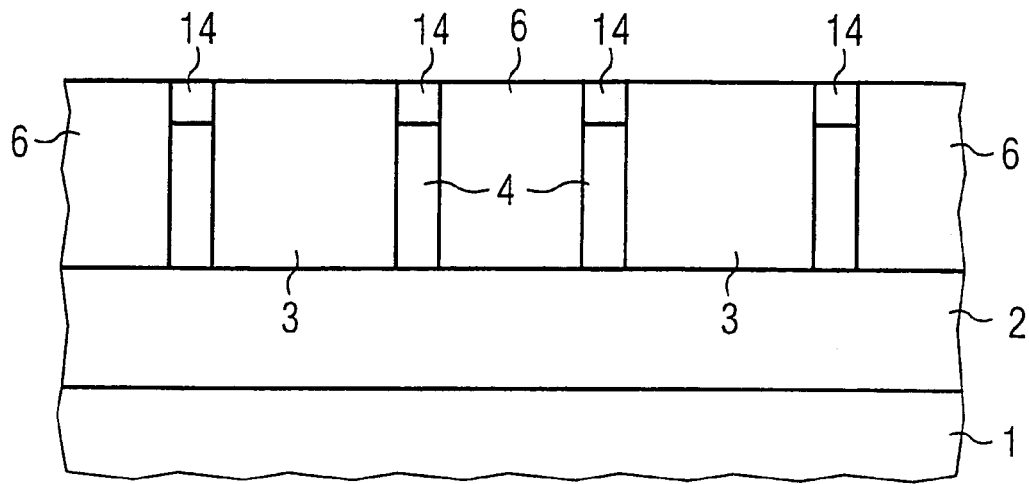

In accordance with FIG. 7, in the relevant regions the holes which are formed above the remaining parts of the material of the gate electrodes 4, which form the word lines, are filled with electrically insulating material 14 and planarized. At the edges of the gate electrodes, the insulating material 14 between the source/drain regions is etched back by means of a spacer etch to form lateral coverings of the conductive material of the gate electrodes 4. In this way, the storage layer 5 is protected toward the side and short circuits with the word line are avoided.

Figure 8:
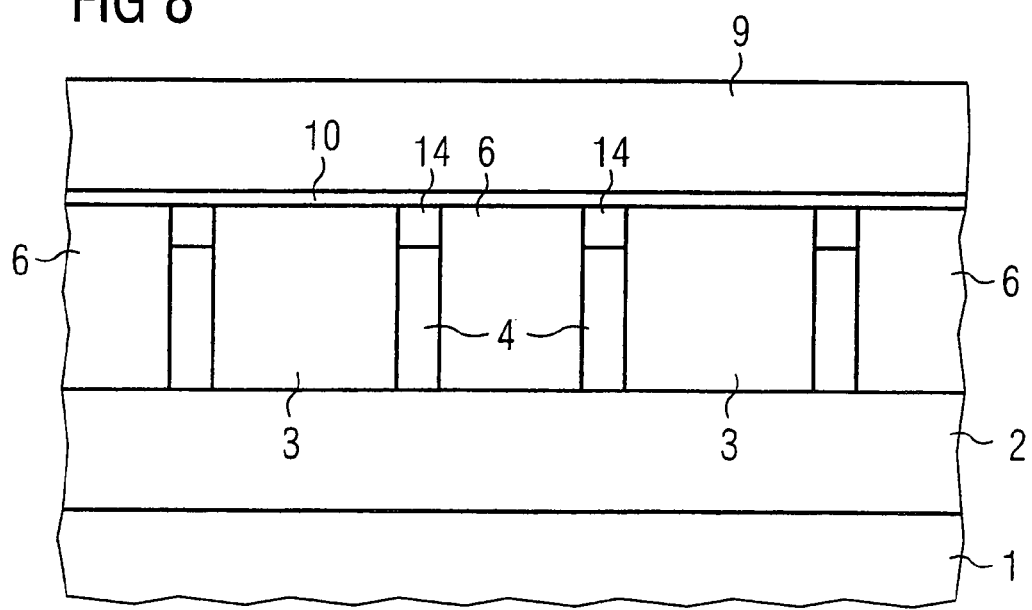

In accordance with the illustration presented in FIG. 8, after the implantations for source and drain (n+ implantation) have been introduced in the regions along the intended bit lines, the material intended for the bit line is applied to the top side of the semiconductor material. It is preferable first of all also to provide a diffusion barrier 10, to which the bit lines 9, for example formed from tungsten, are applied and which prevents outdiffusion of the metal into the semiconductor material. The bit lines are patterned in strip form parallel to one another. The surface can be planarized by CMP (chemical mechanical polishing).

These memory cells are read by means of the two transistors at the side walls of the fins and the transistor beneath the storage medium. The gate electrodes 4 are indeed in each case formed above and to the sides of the fins in the region between the bit lines, so as to bridge the fins. The side wall transistors have high on current, assuming a gate dielectric of suitable equivalent oxide thickness. On account of the side gate effect, the storage layer influences the on current of the FinFET by at least partially shifting the threshold voltage.

Advantages Include:
a) low production costs on account of simple fabrication process,
b) higher read current at low voltages,
c) process compatibility with conventional FinFET transistors, and
d) high storage density of 2 $F^2$ per bit possible.

It is therefore possible, if the semiconductor memory is used as an OTP (one-time programmable) memory, to save a considerable amount of area in the region of intended charge pumps for one-time 6 V programming voltage. The side wall transistors are in this case provided as read transistors, whereas the part of the gate electrodes and the storage layer on the top side of the fins are provided in particular for the storage operation. This results in a higher read current at lower voltages and a shorter read time than with conventional memories.

What is claimed is:

1. A semiconductor memory having a row and column arrangement of bit lines and word lines with a memory cell arranged at each crossing point of a bit line and a word line, comprising:

conductively doped source/drain regions formed in fins of semiconductor material which are arranged parallel to one another, wherein the bit lines are connected to the source-drain regions;

channel regions arranged between the respective source/drain regions and located a distance from one another in a direction of the word lines;

gate electrodes, which are arranged on top and side walls of the respective fins, electrically insulated from and drive the respective channel regions, connected to the word lines, and electrically conductively connected to one another; and storage layers, which are located between the gate electrodes and the semiconductor material on top sides of the respective fins, and are used to program the respective memory cells, wherein the word lines are formed by parts applied to the side walls of the fins of the gate electrodes.

2. The semiconductor memory as claimed in claim 1, wherein the memory layer is an oxide nitride oxide layer sequence.

3. The semiconductor memory as claimed in claim 1, wherein the storage layer is a floating gate electrode, which is electrically insulated all around by the gate electrode and the semiconductor material of the fin.

4. The semiconductor memory as claimed in claim 1, wherein the fins are formed as strip-like parts of a body silicon layer of an SOI substrate.

5. The semiconductor memory as claimed in claim 2, wherein the fins are formed as strip-like parts of a body silicon layer of an SOI substrate.

6. The semiconductor memory as claimed in claim 3, wherein the fins are formed as strip-like parts of a body silicon layer of an SOI substrate.

7. A semiconductor memory having a row and column arrangement of bit lines and word lines, in which a memory cell is arranged at each crossing point of a bit line and a word line, comprising:

source/drain regions formed in fins of semiconductor material which are arranged parallel to and at a distance from one another;

a storage layer arranged on a top side of each of the fins; and a gate electrode arranged on the top side and side walls of each of the fins, the gate electrodes being electrically conductively connected to one another, wherein the word lines are formed by parts applied to the side walls of the fins of the material of the gate electrodes.

* * * * *